US006635542B2

United States Patent
Sleight et al.

(10) Patent No.: US 6,635,542 B2
(45) Date of Patent: Oct. 21, 2003

(54) COMPACT BODY FOR SILICON-ON-INSULATOR TRANSISTORS REQUIRING NO ADDITIONAL LAYOUT AREA

(75) Inventors: Jeffrey W. Sleight, Ridgefield, CT (US); John J. Ellis-Monaghan, Grand Isle, VT (US); Suk Hoon Ku, Beacon, NY (US); Patrick R. Varekamp, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 09/879,579

(22) Filed: Jun. 12, 2001

(65) Prior Publication Data

US 2002/0187612 A1 Dec. 12, 2002

(51) Int. Cl.$^7$ .................. H01L 21/331; H01L 21/8222
(52) U.S. Cl. .......................... 438/311; 438/197
(58) Field of Search .................. 438/149, 197, 438/220, 231, 232, 286, 289, 294, 301, 305, 306, 311, 981

(56) References Cited

U.S. PATENT DOCUMENTS

| | | | | |
|---|---|---|---|---|
| 5,547,894 A | * | 8/1996 | Mandelman et al. | 438/220 |
| 5,923,987 A | * | 7/1999 | Burr | 438/304 |
| 6,110,783 A | * | 8/2000 | Burr | 438/286 |

* cited by examiner

Primary Examiner—David Nhu

(57) ABSTRACT

A non-critical block mask exposes one of the source and drain in an SOI FET, which is implanted with a leakage implant that increases the leakage in the exposed element, thus providing a conductive path to draw away holes from the transistor body.

9 Claims, 2 Drawing Sheets

COMPACT BODY FOR SILICON-ON-INSULATOR TRANSISTORS REQUIRING NO ADDITIONAL LAYOUT AREA

FIELD OF THE INVENTION

The field of the invention is that of forming a body contact in SOI integrated circuits.

BACKGROUND OF THE INVENTION

The need for a body contact in SOI FETs is well known. Many schemes have been proposed to provide a conductive path to ground to draw holes away from the transistor body. A straightforward approach is to increase the active area within the isolation dielectric to provide room to place a contact on the surface and an implant below the surface to provide a low-resistance path from the body to the contact. Such an approach, of course, takes up valuable silicon area.

Additionally, as the silicon device layer becomes thinner, it becomes increasingly more difficult to contact the body without incurring a large series resistance in the traditional approach.

SUMMARY OF THE INVENTION

The invention relates to a body contact that employs a leaky p-n junction (diode) in one of the source and drain, so that a conductive path is formed from the body through the leaky p-n junction to the transistor terminal. The other p-n junction in the FET has standard properties, so that there is no excessive leakage through the transistor.

A feature of the invention is the use of a non-critical block mask for one or more leakage implants, together with an angled leakage implant that penetrates under the gate to deliver a higher concentration of leakage ions at the p-n junction.

DESCRIPTION OF THE PREFERRED EMBODIMENT

Figure 1:
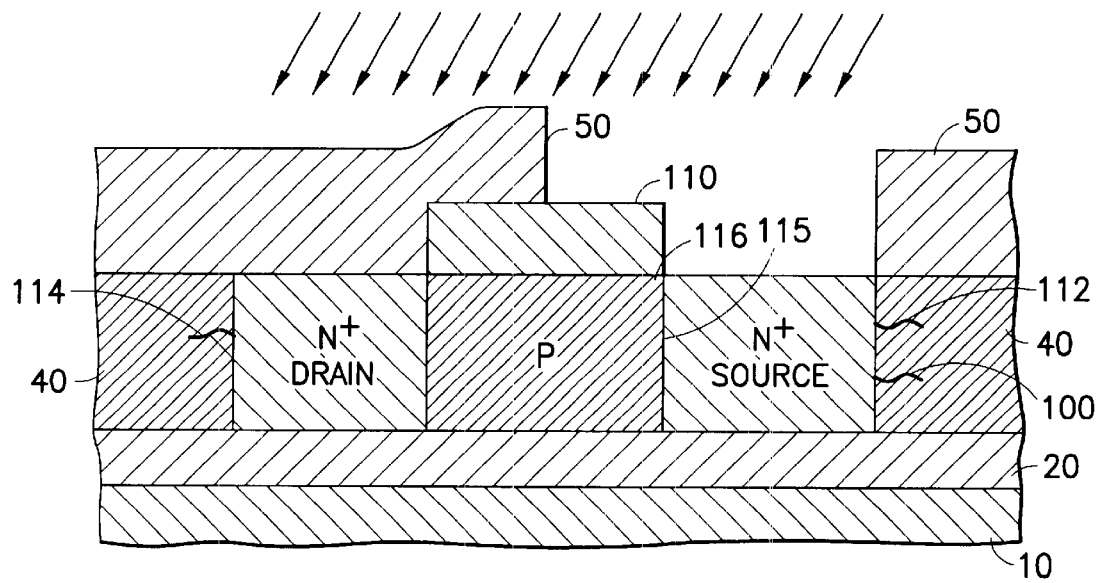
FIG. 1 shows in cross section a transistor being implanted according to the invention.

Referring now to FIG. 1, there is shown in cross section a transistor constructed according to the invention. A conventional substrate 10 with an insulator layer 20, illustratively a buried oxide (BOX) layer formed by implantation of oxygen into substrate 10 supports silicon device layer 100. Device layer 100 contains an NFET including source 112, drain 114 on either side of body 116, the body being below gate 110. A p-n source junction 115 is formed between the N+ source 112 and p-type body 116. The transistor is formed by conventional processes. The transistor is surrounded by dielectric isolation 40.

A non-critical blocking mask 50 has been put down and patterned, illustratively forming an aperture having one edge on the gate and the other over the isolation.

An ion implant is shown as being implanted at an angle, so that a higher concentration of ions reaches junction 115 than would be the case if the implant were vertical. Illustratively, the ion species may be Indium, Germanium, Carbon or other implanted species. The term "leakage implant" will be used herein to mean an implant the primary effect of which is to increase the leakage current across the p-n junction. Boron or Phosphorous, for example, would not normally be leakage implants because they primarily change the characteristics of the p-n junction.

A typical dose would be in the range of $1\times10^{12}/cm^2$ to $1\times10^{15}/cm^2$. The voltage will be set according to the thickness of the device layer and the implant species, typically in the range from about 5 to 80 keV. It is an advantageous feature of the invention that the body tie extends along the full length of the source, thus providing low resistance without any area penalty. For convenience, FIG. 1 will be referred to as looking North, so the implant is coming in from the East. The leakage implant is preferably not annealed for long periods of time or at high temperatures.

Figure 2:
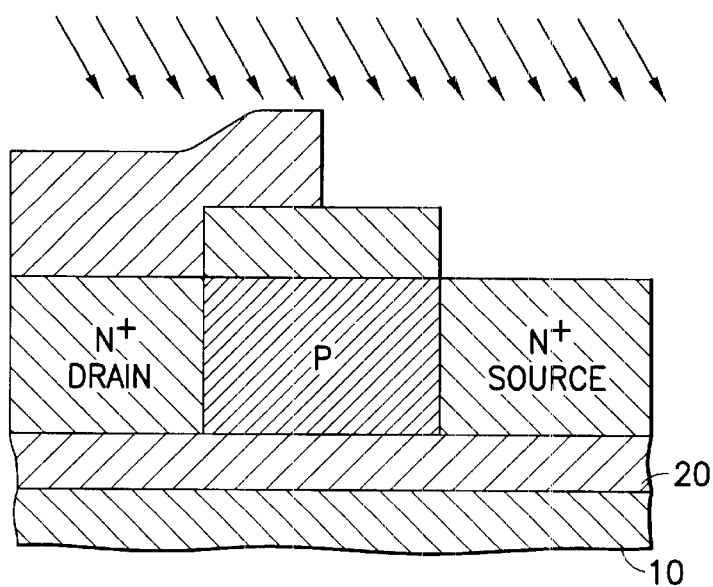
FIG. 2 shows in cross section a transistor being implanted in a way that avoids implants where they are not wanted.

Referring to FIG. 2, there is shown a case where the implant comes from the other side of the transistor (the West, where the same North-looking orientation is assumed). In that case, the resist and/or gate blocks the ions, so that the area close to the gate edge does not receive a direct implant. Those skilled in the art will appreciate that, when the implant dose is set to apply an optimum ion concentration to sources exposed as in FIG. 1, the embodiment of FIG. 2 will not receive an adequate dose.

Figure 4:
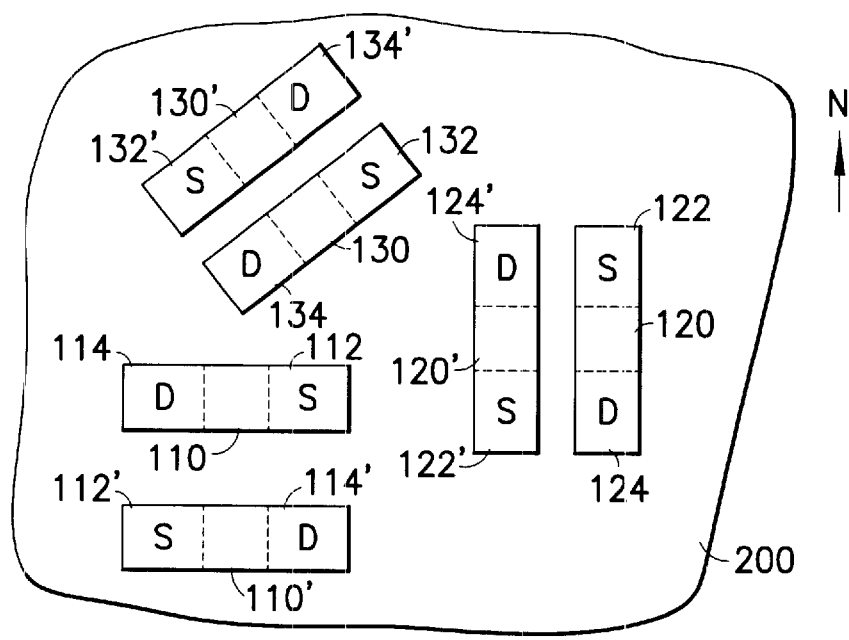
FIG. 4 shows a plan view of a set of transistors oriented at different angles.

Referring to FIG. 4, there is shown a plan view of a portion of a circuit. In an area denoted with the numeral 200, there are six transistors oriented in three different directions. Transistor 110, referred to as being disposed along a first axis, is oriented along the E-W direction, with source 112 on the East. Transistor 120, referred to as being disposed along a second axis perpendicular to the first axis, is oriented along the N-S direction, with source 112 on the North. Transistor 130, referred to as being disposed along a third axis at an acute angle with respect to the first axis, is oriented along a NE-SW direction, with source 132 on the North-East end. Transistors 110', 120' and 130' are the complementary set, aligned along the same axes, but in the opposite sense. If the circuit designer has chosen to have some E-W transistors with the source on the East and also some with the source on the West, then implants from both directions will be required to cover both the set and the complementary set.

Figure 3:
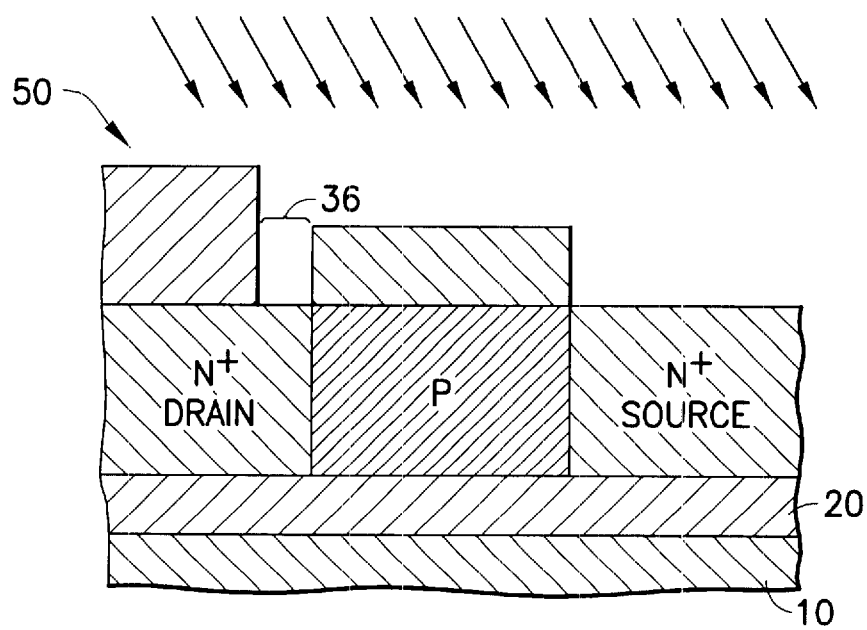
FIG. 3 shows in cross section a transistor being implanted with a misaligned mask.

Referring now to FIG. 3, there is shown a transistor and implant as in FIG. 2, but with a gap 36 between the mask and the gate. With the implant orientation shown, the area within gap 36 will not be significantly implanted because of the shadowing effect of mask 50. The same applies if the implant is oriented as in FIG. 1, because of shadowing by the gate. If the implant comes from the North or South, however, then a significant number of ions may be implanted, depending on the width of the gap, the magnitude of the dose and the ease of diffusion of the ions. Thus, the mask alignment of FIG. 1 or 2 is preferable.

In the most general case, there will be six implant orientations for the cases illustrated in FIG. 4. There need be only one mask, since the total dose is the sum of all the angled implants.

The invention applies as well to PFETs. In that case, the drain receives the leakage implant. The ions used are typically the same species for both NFETs and PFETs, but this does not have to be the case. If different ions are used for NFETs and PFETs, then there will be appropriate changes in the number and locations of masks. A CMOS circuit will have both NFETs and PFETS with this leakage implant.

The invention may be practiced with bonded SOI wafers and with SiGe substrates, as well as with implanted wafers and silicon substrates. While the invention has been described in terms of a single preferred embodiment, those skilled in the art will recognize that the invention can be practiced in various versions within the spirit and scope of the following claims.

We claim:

1. A method of forming an SOI integrated circuit comprising the steps of:
   preparing an SOI substrate having a silicon device layer above an underlying dielectric, including forming a set of isolation members that define a set of active areas in said device layer;
   forming a set of NFETs in said set of active areas, said set of NFETs having a set of NFET sources, a set of NFET gates and a set of NFET drains;
   forming a block mask that exposes said set of NFET sources of said set of NFETs while blocking said set of NFET drains;
   implanting a set of p-n source junctions at said set of NFET sources with a leakage implant to form body contacts from portions of said silicon device layer below said set of NFET gates through said p-n source junctions to said NFET sources; and
   completing said SOI integrated circuit.

2. A method of forming an SOI integrated circuit according to claim 1, further comprising the steps of:
   implanting said leakage implant at an angle such that ions in said leakage implant are directed below said set of NFET gates, whereby a higher ion concentration is present at said set of p-n source junctions under said set of NFET gates.

3. A method for forming an SOI integrated circuit comprising the steps of:
   preparing an SOI substrate having a silicon device layer above an underlying buried dielectric layer, including forming a set of isolation members that define a set of active areas in said device layer;
   forming a set of NFETs in said set of active areas, said set of NFETs having a set of NFET sources, a set of NFET gates and a set of NFET drains;
   forming a block mask that exposes said set of NFET sources of said set of NFETs while blocking said set of NFET drains;
   implanting a set of p-n source junctions at said set of NFET sources with a leakage implant that forms a body contact having a conductive path from that portion of said device layer below said set of NFET gates through said set of p-n source junctions to said set of sources; and
   completing said SOI integrated circuit.

4. A method according to claim 3, further comprising the steps of: implanting said leakage implant at an angle such that ions in said leakage implant are directed below said set of NFET gates, whereby a higher ion concentration is present at said set of p-n source junctions under said set of NFET gates.

5. A method according to claim 4, in which said leakage implant is performed with ions selected from one or more elements in the group consisting of Indium, Germanium and Carbon.

6. A method of forming an SOI integrated circuit comprising the steps of:
   preparing an SOI substrate having a silicon device layer above an underlying buried dielectric layer, including forming a set of isolation members that define a set of active areas in said device layer;
   forming a set of NFETs in said set of active areas, said set of NFETs having a set of NFET sources, a set of NFET gates and a set of NFET drains;
   forming a set of PFETs in said set of active areas, said set of PFETs having a set of PFET drains, a set of PFET gates and a set of PFET sources;
   forming a block mask that a) exposes said set of NFET sources of said set of NFETs while blocking said set of NFET drains; and b) exposes said set of PFET drains of said set of PFETs while blocking said set of PFET sources;
   implanting a set of p-n source junctions at said set of NFET sources and a set of p-n drain junctions at said set of PFET drains with a leakage implant that forms body contacts having conductive paths from that portion of said device layer below said sets of NFET gates through said set of p-n source junctions to said set of NFET sources and from that portion of said device layer below said sets of PFET gates through said set of p-n drain junctions to said set of PFET drains; and
   completing said SOI integrated circuit.

7. A method according to claim 6, further comprising the steps of: implanting said leakage implant at an angle such that ions in said leakage implant are directed below said sets of NFET and PFET gates, whereby a higher ion concentration is present at a set of p-n source junctions under said set of NFET gates and at a set of p-n drain junctions under said set of PFET gates.

8. A method according to claim 7, in which said leakage implant is performed in said set of NFETs and said set of PFETs using a single block mask which remains in place throughout.

9. A method according to claim 8, in which said leakage implant is performed with ions selected from one or more elements in the group consisting of Indium, Germanium and Carbon.

* * * * *